(12) United States Patent
Takita

(10) Patent No.: US 6,392,484 B1
(45) Date of Patent: May 21, 2002

(54) AMPLIFIER WITH COMBINED PULSED ENERGY OUTPUT AND LINEAR TYPE OUTPUT

(75) Inventor: Mark K. Takita, Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/628,591

(22) Filed: Jul. 31, 2000

(51) Int. Cl.$^7$ ................................................ H03F 3/217
(52) U.S. Cl. .......................................... 330/251; 330/10
(58) Field of Search ............................. 330/10, 207 A, 330/251, 129

(56) References Cited

U.S. PATENT DOCUMENTS

| | | | |
|---|---|---|---|
| 4,446,440 A | * 5/1984 | Bell | 330/10 |
| 5,204,594 A | 4/1993 | Carobolante | 318/254 |
| 5,309,078 A | 5/1994 | Cameron | 318/811 |
| 5,329,245 A | 7/1994 | Hammond et al. | 330/251 |
| 5,723,963 A | 3/1998 | Li et al. | 318/590 |
| 5,731,670 A | 3/1998 | Galbiati et al. | 318/254 |
| 5,847,602 A | * 12/1998 | Su | 330/10 |
| 5,963,086 A | * 10/1999 | Hall | 330/10 |
| 6,016,075 A | * 1/2000 | Hamo | 330/10 |

FOREIGN PATENT DOCUMENTS

| | | | |
|---|---|---|---|
| EP | 0 082 282 A1 | 6/1983 | H03F/3/217 |
| FR | 2 693 856 A1 | 1/1994 | H02P/8/00 |
| JP | 7-202590 | 8/1995 | |

* cited by examiner

*Primary Examiner*—Robert Pascal
*Assistant Examiner*—Henry Choe
(74) *Attorney, Agent, or Firm*—Skjerven Morrill MacPherson LLP

(57) ABSTRACT

A single stage amplifier system that produces an accurate linear output signal during low power demands and a pulse modulated output signal during high power demands is disclosed. A control circuit provides a linear signal and a pulsed signal to an output stage in response to a select signal provided by an external circuit. The single output stage includes two transistors in a push-pull arrangement that can be driven in their saturation regions when a pulsed signal is provided by the control circuit or driven within their linear region when a linear signal is provided. The single stage amplifier system can be used in either a half bridge amplifier system or an H-bridge amplifier system.

15 Claims, 2 Drawing Sheets

AMPLIFIER WITH COMBINED PULSED ENERGY OUTPUT AND LINEAR TYPE OUTPUT

FIELD OF THE INVENTION

The present invention relates to an amplifier system in general, and in particular to an amplifier system that can be operated in a linear output mode or a pulsed modulation output mode.

BACKGROUND

An amplifier system that drives a motor in high-precision industrial equipment should be accurate while maintaining a high level of energy transfer efficiency. Often high-precision industrial equipment, such as a lithography machine, has two modes of operation; a scanning mode and a stepping mode. In scanning mode, a positioning system positions a workpiece, such as a silicon wafer, in a precise and smooth manner. The workpiece is located on a stage. Thus, the amplifier system that drives a motor to move the stage in scanning mode should produce an accurate and linear output signal to the motor. Linear type amplifiers are therefore desirable for use in a high-precision positioning system while in scanning mode.

However, when the positioning system in the machine is in stepping mode, the workpiece on the stage is quickly moved from one position to the next. In stepping mode the positioning system generates large forces to accelerate and decelerate the stage to its new position. Thus, power transfer efficiency is important during stepping mode, and precision is less important. An amplifier system that produces a pulsed energy output, such as pulse width modulation (PWM) or pulsed period modulation (PPM), is highly efficient and therefore desirable for use in a positioning system while in stepping mode.

FIG. 1 is a schematic diagram of a dual stage amplifier system 10 used to produce a linear type output signal at terminal OUT as well as a PWM type output signal in response to an input signal at terminal IN. Amplifier system 10 includes a conventional linear amplifier output stage 20 with a PNP transistor 22 and a NPN transistor 24 arranged in a push-pull emitter follower configuration. Transistors 22 and 24 require resistors 25, 26, and diodes 27, 28 to eliminate crossover distortion.

Amplifier system 10 also has a PWM amplifier stage 30 including transistors 32 and 34. Transistors 32 and 34 in PWM amplifier stage 30 are turned off and transistors 22 and 24 are driven in their linear regions when a linear type output at terminal OUT is desired. When a PWM output is desired, transistors 22 and 24 in linear amplifier stage 20 are driven into saturation and the transistors 32 and 34 in PWM amplifier stage 30 are actuated. Thus, dual stage amplifier system 10 can be controlled to produce either linear type output signals or PWM type output signals.

The dual stage amplifier system 10 is disadvantageous because it requires two sets of transistors conducting simulatneously, resulting in decreased efficiency and precision. When amplifier system 10 is in PWM mode, the PWM output signal must be driven through saturated transistors 22 and 24, which generate heat. Thus, in PWM mode, transistors 22 and 24 generate heat. Moreover, transistors 22 and 24 require resistors 25, 26, and diodes 27, 28 to eliminate crossover distortion and, thus, further decrease efficiency.

SUMMARY

The present invention is directed to a single stage amplifier system that produces an accurate linear output signal, i.e., the output signal is directly proportional to the input signal, during low power demands or when high performance is desired, and produces a pulse modulated output signal when power transfer efficiency is desired such as during high power demands. The amplifier system includes a control circuit that switches between a linear mode control circuit and a pulsed mode control circuit to control a single output stage. The single output stage includes two transistors in a push-pull arrangement that are driven in their saturation regions when a pulsed output signal is desired, and are driven within their linear region when a linear output signal is desired.

In one embodiment, the single stage amplifier system of the present invention is used in a half-bridge amplifier system to drive a load, such as a motor, while in another embodiment the signal stage amplifier system is used in an H-bridge amplifier system.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 1:
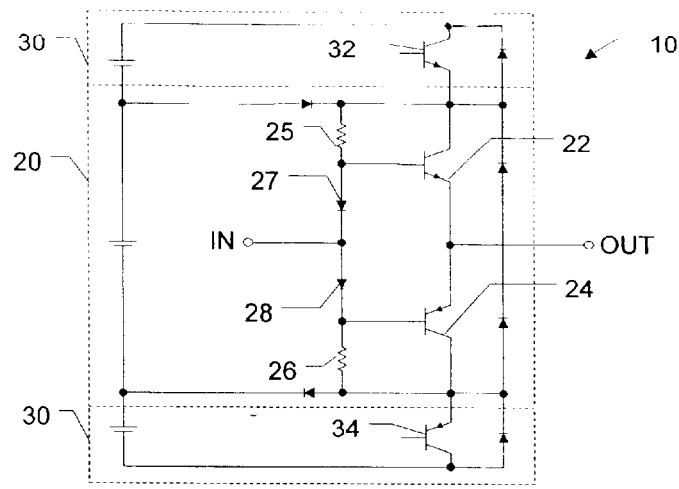
FIG. 1 is a schematic diagram of a dual stage amplifier system that operates in a PWM output mode as well as a linear mode in accordance with the prior art.
Figure 2:
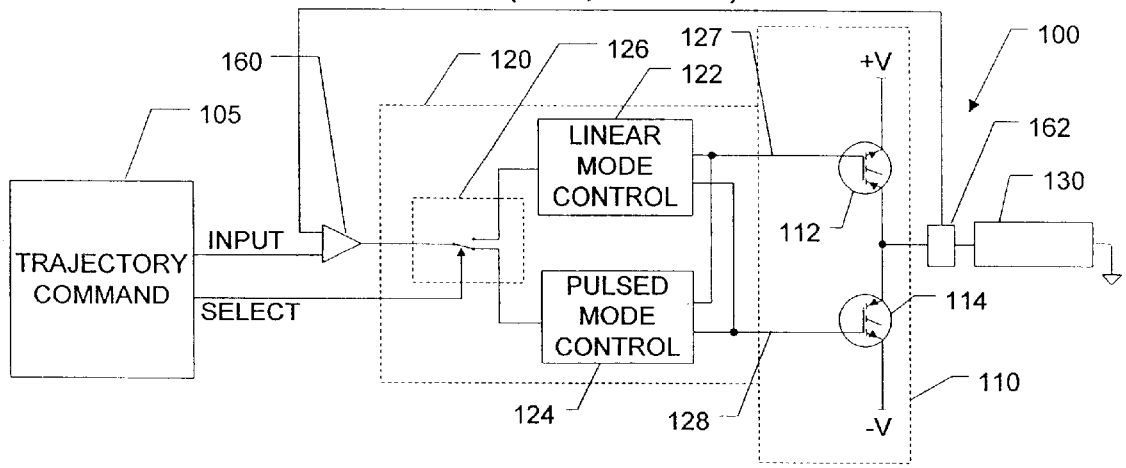
FIG. 2 is a schematic diagram of a single stage amplifier system that operates in a pulse modulation mode as well as a linear output mode in accordance with the present invention.

FIG. 2 is a schematic diagram of a single stage amplifier system 100 that is controlled to produce an output signal in pulsed modulation mode or a linear mode.

Amplifier system 100 includes an output stage 110, that receives and amplifies a control signal from a control circuit 120 to provide an amplified output signal to a load 130, such as a motor. Output stage 110 has two voltage supply terminals connected respectively to the collector terminals of two transistors 112 and 114. The first voltage supply terminal +V provides a positive voltage to transistor 112 while the second voltage supply terminal −V provides a negative voltage to transistor 114. It will be appreciated by those skilled in the art, however, that either voltage supply terminal +V or −V may be connected to ground potential, thus limiting the range of voltages supplied to output stage 110.

The emitter terminals of both transistors 112, 114 are connected to load 130, while the gates of transistors 112, 114 are connected to control circuit 120 via respective leads 127 and 128. Transistors 112, 114 are a P channel transistor and an N channel transistor, respectively.

Transistors 112, 114 preferably have good linearity and switching characteristics. For example, transistors 112, 114 can be insulated gate bipolar transistors (IGBT). However, any switching device with good linearity and switching parameters can be used. Thus, for example, JFETs may be used as transistors 112, and 114.

Control circuit 120 drives transistors 112, 114 in their linear operating region when a linear output signal is desired. Likewise, when a pulsed output signal is desired, control circuit 120 drives transistors 112, 114 in their saturation regions. Thus, output stage 110 produces a linear output signal or a pulsed output signal.

The control circuit 120 of amplifier system 100 receives an analog input signal at terminal INPUT and a select signal at terminal SELECT from a trajectory command circuit 105. Trajectory command circuit 105 provides an analog input signal according to the desired performance of load 130 driven by amplifier system 100. The select signal is provided by trajectory command circuit 105 to indicate the desired mode of output signal, i.e., linear output signal or pulsed output signal. Trajectory command circuit 105 is, for example, a digital signal processor or microprocessor as is well known to those skilled in the art.

Control circuit 120 includes a linear mode control circuit 122 and a pulsed mode control circuit 124. Input terminal INPUT is switchably connected to linear mode control circuit 122 and pulsed mode control circuit 124 by way of an enable circuit 126.

Linear mode control circuit 122 conventionally outputs linear mode control signal on leads 127, 128 having an amplitude proportional to that of the analog input signal when enabling circuit 126 connects linear mode control circuit 122 to input terminal INPUT. Likewise, when pulsed mode control circuit 124 is connected to input terminal INPUT via enabling circuit 126, pulsed mode control circuit 124 conventionally outputs pulsed control signals on leads 127, 128 having pulse widths that are proportional to the amplitude of the analog input signal. It is appreciated that the pulsed control signals may be PWM signals, PPM signals, or any other desired pulsed energy signals. Producing a linear mode control signal and a pulsed control signal proportional to an analog input signal is well within the ability of those skilled in the art.

Enable circuit 126 is illustrated in FIG. 2 as a switch that responds to the select signal from trajectory command circuit 105 to connect and thus enable either linear mode control circuit 122 or pulsed mode control circuit 124. The particular illustrated manner of enabling either linear mode control circuit 122 or pulsed mode control circuit 124 represents the functionality of enabling circuit 126, and is not limiting. Many alternative means of accomplishing the function of enabling circuit 126 will be readily apparent to those of skill in the art. By way of example, the input signal from trajectory command circuit 105 may be received simultaneously by linear mode control circuit 122 and pulsed mode control circuit 124, while a select signal enables only the desired circuit to provide a control signal to output stage 110. Moreover, the amplitude of the analog input signal may be used as the select signal. For example, if the amplitude of the input signal exceeds a specific magnitude pulsed mode control circuit 124 is enabled, while if the input signal's amplitude is below that magnitude linear mode control circuit 122 is enabled. Using the magnitude of an input signal to select between a number of control circuits is well within the skill of those in the art.

A feedback error correction circuit 160 and sensor 162 may optionally be used to compensate for zero cross over distortion, i.e., when the output signal crosses from positive to negative or negative to positive while in linear mode. Transistor 112 may compensate for zero cross over distortion by precisely and rapidly slewing across zero. Using a feedback error correction circuit and sensor to control a transistor compensating for zero cross over distortion is well within the skill of those in the art.

Figure 3A:
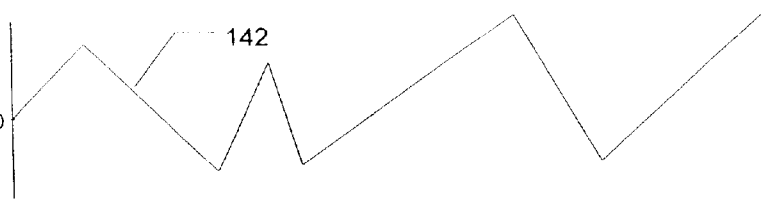
FIG. 3A illustrates an analog input signal on input terminal INPUT of the amplifier system in accordance with the present invention.
Figure 3B:
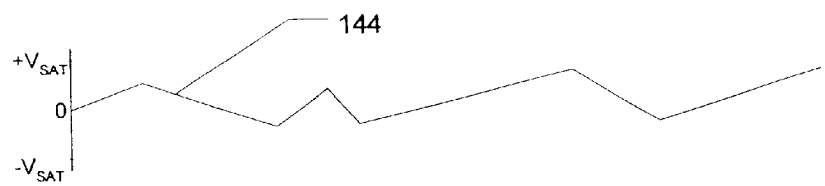
FIG. 3B illustrates a linear mode control signal generated by the linear mode control circuit in response to the analog input signal shown in FIG. 3A.
Figure 3C:
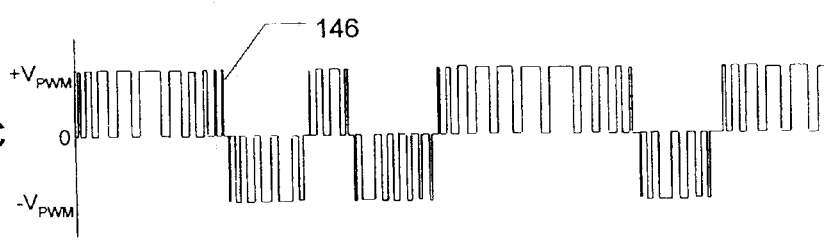
FIG. 3C illustrates a pulsed mode control signal produced by the pulsed mode control circuit in response to the analog input signal shown in FIG. 3A.
Figure 3D:
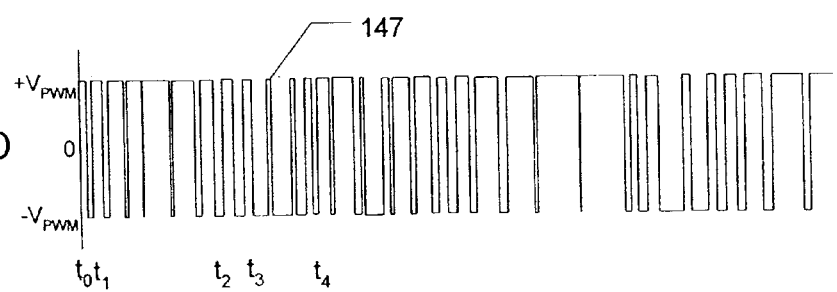
FIG. 3D illustrates another embodiment of a pulsed mode control signal produced by the pulsed mode control circuit in response to the analog input signal shown in FIG. 3A.

FIGS. 3A–3D graphically illustrate a respective analog input signal 142 on input terminal INPUT, the corresponding control signal 144 provided by linear mode control circuit 122, and the corresponding control signal 146 or control signal 147 provided by pulsed mode control circuit 124. Although FIGS. 3B, 3C, and 3D show control signals based on the same analog input signal 142, it is understood that only one of control signals 144, 146, or 147 is received by output stage 110 at any one time, where the select signal from trajectory command circuit 105 determines which control signal is received by output stage 110.

FIG. 3A illustrates the analog input signal 142 from trajectory command circuit 105 on input terminal INPUT. Analog input signal 142 can be either a current signal or a voltage signal and has an amplitude proportional to the desired performance of load 130 (e.g. a motor) driven by amplifier system 100.

FIG. 3B illustrates a linear control signal 144 generated by linear mode control circuit 122, shown in FIG. 2. Linear-control signal has an amplitude in direct proportion to that of analog input signal 142. Linear mode control circuit 122 controls the linear mode control signal 144 such that it is less than the saturation voltage $+V_{SAT}$ for transistor 112 and $-V_{SAT}$ for transistor 114, where ground potential is represented by "0." Linear control signal 144 may be provided simultaneously on leads 127, 128 or may be split into two signals, with the segments of the signal that are greater than 0 provided on lead 127 and the segments of the signal less than 0 provided on lead 128. Thus, when output stage 110 receives the linear control signal 144, transistors 112, 114 are driven within their respective linear operating regions. Consequently, output stage 110 produces a linear output signal to load 130.

FIG. 3C illustrates a pulsed control signal 146 produced by pulsed mode control circuit 124, shown in FIG. 2. Pulsed control signal 146 is illustrated as a voltage PWM signal and has a duration in proportion to the amplitude of analog input signal 142. Pulsed control signal 146, of course, could be any pulsed energy signal and is not limited to PWM. The pulses of pulsed control signal 146 range from $+V_{PWM}$ to 0 and from 0 to $-V_{PWM}$, where $+V_{PWM}$ is greater than the saturation voltage $+V_{SAT}$ for transistors 112, 114, and ground potential is symbolized as "0." Pulsed control signal 146 may be provided simultaneously on leads 127, 128 or may be split into two signals, with the segments of the signal that are greater than 0 provided on lead 127 and the segments of the signal less than 0 provided on lead 128. Thus, pulsed control signal 146 from pulsed mode control circuit 124 will drive transistors 112, 114 in their respective saturation ranges to produce a pulsed output signal on load 130.

FIG. 3D illustrates an alternative pulsed control signal 147 produced by pulsed mode control circuit 124, shown in FIG. 2. Pulsed control signal 147 is similar to control signal 146 shown in FIG. 3C except that pulsed control signal 147 ranges from $+V_{PWM}$ to $-V_{PWM}$. As shown in FIG. 3D, between times $t_1$ and $t_2$, for example, transistors 112 and 114 have approximately equal "on" periods and thus, provide an average of "zero" energy to load 130. As can be seen in FIG. 3D, between times $t_1$ and $t_2$, more positive energy is provided to load 130, while between times $t_3$ and $t_4$ more negative energy is provided to load 130. Pulsed control signal 147 is provided on only one of leads 127 and 128 depending on which transistor 112 or 114 is to be driven. Thus, pulsed control signal 147 from pulsed mode control circuit 124 will drive one of transistors 112, 114 in their respective saturation ranges to produce a pulsed output signal on load 130.

Consequently, amplifier system 100 can be controlled to produce a pulsed output signal or a linear output signal when desired. Thus, when a linear output signal would be inefficient, for instance during high power output demands or in stepping mode, a pulsed output signal is produced. During low power output demands or when high performance is desired, such as in scanning mode, amplifier system 100 produces a linear output signal.

Figure 4:
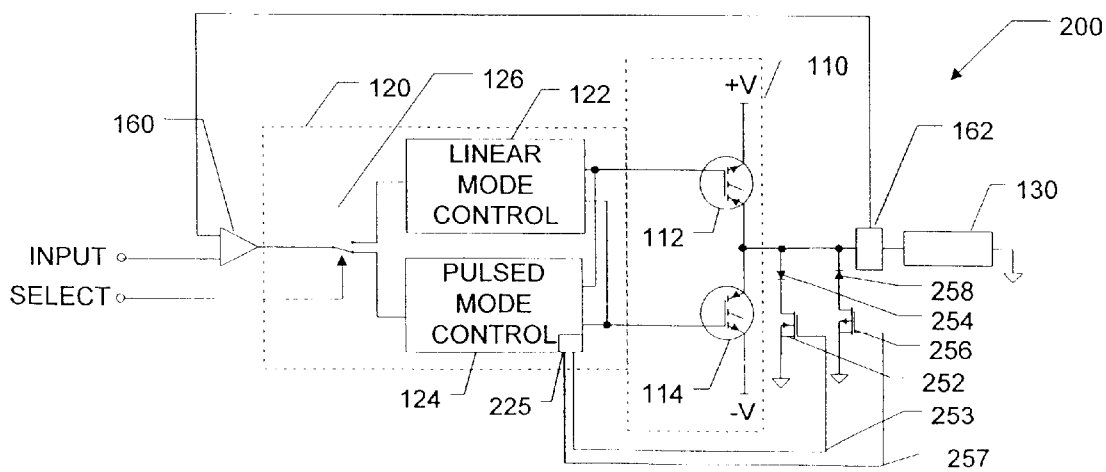
FIG. 4 is a schematic diagram of a half-bridge amplifier system using the single stage amplifier system of the present invention.

FIG. 4 is a schematic diagram of a half-bridge amplifier system in which output stage 110 is connected to load 130, in accordance with the present invention. Half-bridge amplifier system 200 is similar to amplifier system 100, with like designated elements being the same. However, half-bridge amplifier system 200 includes additional switches 252 and 256 switchably connecting load 130 to ground potential through respective diodes 254 and 258 when amplifier system 200 is in pulsed output mode. Switches 252 and 256 are maintained off when amplifier system 200 is operating in linear output mode. Switch 252 is shown as an N-channel MOSFET and switch 256 is shown as a P-channel MOSFET, although other devices with fast switching characteristics may work as well. Of course, if voltage supply terminal $-V$ is held at ground potential, transistor 114 switchably connects load 130 to ground potential and switches 252 and 256 are unnecessary.

The gates of switches 252 and 256 are connected to pulsed mode control circuit 124 via an enable/disable circuit 225. Pulsed mode control circuit 124 turns on switches 252 and 256 when the pulsed control signal, shown for example in FIG. 3C, is at ground potential. When the pulsed control signal is above or below ground potential, at either $+V_{PWM}$ or $V_{PWM}$, pulse mode control circuit 124 turns off switches 252 and 256. Thus, load 130 is alternately connected between ground potential through switches 252 and 256 and either voltage supply terminal $+V$ or $-V$ through respective transistors 112 and 114.

In addition a variable power supply may be used as voltage power supplies $+V$ and $-V$ in output stage 110 to eliminate the need to shorten the pulse width or pulse period when producing a low power output signal. For information relating to variable voltage supplies, see the patent entitled "Pulse-Width Modulation System," by Mark K. Takita, U.S. Pat. No. 6,175,272, issued on Jan. 16, 2001, and having the same assignee, the contents of which are incorporated herein by reference.

Figure 5:
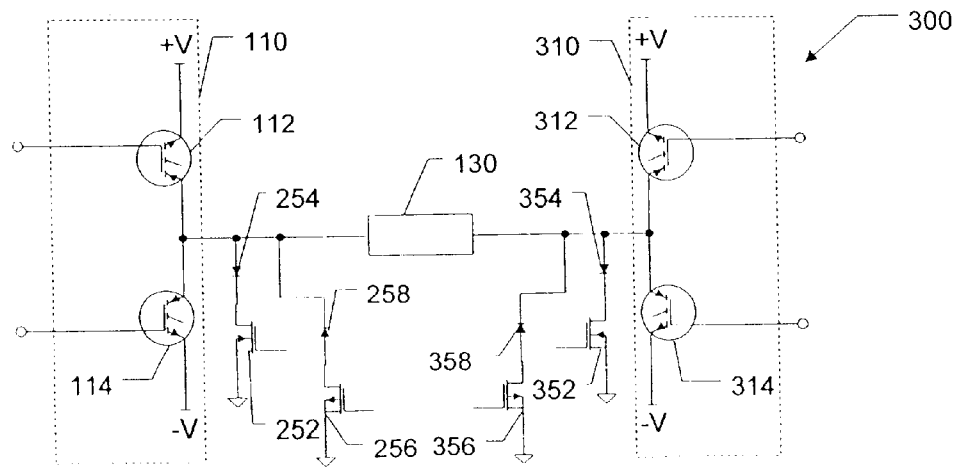
FIG. 5 is a schematic diagram of an H-bridge amplifier system using the single stage amplifier system of the present invention.

FIG. 5 is a schematic diagram of an H-bridge amplifier system 300 configured to use two output stages both of which work in accordance with the present invention. For information relating to the workings of H-bridge amplifiers, see the patent entitled "H-BRIDGE POWER AMPLIFIER FOR A MOTOR," by Mark K. Takita, U.S. Pat. No. 6,204,729, issued on Mar. 20, 2001, and having the same assignee, the contents of which are incorporated herein by reference.

H-bridge amplifier system 300 is similar to half bridge amplifier system 200 in FIG. 4, with similar elements designated the same. However, H-bridge amplifier system 300 is configured such that load 130 is disposed between output stage 110 and a second output stage 310, which includes PNP transistor 312 and NPN transistor 314. Switch 352 and 356, shown as an N-channel MOSFET and a P-channel MOSFET, respectively, switchably connect one terminal of load 130 to ground potential through diodes 354 and 358, while switches 252 and 256 switchably connect the other terminal of load 130 to ground potential through diodes 254 and 258. Second output stage 310 is driven by a second control circuit (not shown) similar to control circuit 120.

In the alternative, second output stage 310 may be driven by control circuit 120 after the control signals have passed through circuitry (not shown) necessary to produce complementary control signals. Producing complementary signals is well within the skill of those in the art.

H-bridge amplifier system 300 has several modes of operation. For example, H-bridge amplifier system 300 may operate in a linear mode. While in linear mode, H-bridge amplifier system 300 may operate in a differential mode in which transistors 112 and 312 are used to the exclusion of transistors 114 and 314, or transistors 114 and 314 are used to the exclusion of transistors 112 and 312. Consequently, cross over distortion problems are avoided.

H-bridge amplifier system 300 may also operate in linear mode using only transistors 112 or 114 while transistors 352 and 356 connect load 130 to ground. Thus, second output stage 310 is turned off. In this mode, control and/or feedback circuit 160 improves distortion.

Further, H-bridge amplifier system 300 may use transistors 112 and 314 together and use transistors 114 and 312 together in a differential linear mode. In this mode, for example, the second control circuit drives second output stage 310 with control signals that are complements to the control signals produced by control circuit 120. Through the use of intelligent control, H-bridge amplifier system 300 can be operated to dynamically control the power level at which cross over distortion occurs, or to operate system 300 for best efficiency, or to operate system 300 for best performance.

H-bridge amplifier system 300 may also operate in a pulsed output mode. In one embodiment of pulsed output mode, H-bridge amplifier system 300 switchably connects one terminal of load 130 to the high voltage supply terminal $+V$, while the other terminal of load 130 is connected to the low voltage supply terminal $-V$. For example, transistors 112 and 314 may be on while transistors 312 and 114 are off, and likewise transistors 312 and 114 are on while transistors 112 and 314 are off. Thus, where the absolute values of the voltages in the high and low voltage supply terminals are equal ($|+V|=|-V|$), the voltage across load 130 will be $\pm 2V$ ($+V-(-V)=+2V; -V-(+V)=-2V$). Consequently, lower voltage transistors may be used.

In another embodiment of pulsed output mode, H-bridge amplifier system 300, connects alternate terminals of load 130 to ground potential through switches 252, 256 and 352, 356, while output stages 110 and 310 switchably connect the terminals of load 130 to voltage supply terminals $+V$ and $-V$. Thus, for example, H-bridge amplifier system 300 may switch between transistor 112 and transistors 352, 356 being on and transistor 312 and transistors 252, 256 being on. Of course H-bridge amplifier system 300 may also maintain one terminal of load 130 connected to ground while one of output stage 110 or 310 switches between voltage supply terminals +V and −V. Thus, for example, transistors 352, 356 may remain on while output stage 110 switches between transistors 112 and 114. Again, voltage supply terminal −V or +V may be at ground potential, thus obviating the need for switches 252, 256, 352, and 356.

As will be understood by those of ordinary skill in the art, the two pulsed output modes may be combined to obtain certain advantages, such as precision in power transfer. Combination of the two pulsed output modes may be particularly desirable where the absolute values of the high and low voltage supply terminals +V and −V are unequal.

Moreover, H-bridge amplifier system 300 may operate in a mixed mode, where both a linear mode and a pulsed output mode are used. For example, output stage 110 may operate in linear mode, while transistors 312 and 314 of second output stage 300 operate in a pulsed output mode, where the voltage supply terminals +V and −V of output stage 110 provide smaller voltages than the voltage supply terminals of second output stage 310. Using the mixed mode permits the pulses of the pulsed output to become larger when the energy across load 130 is near zero by increasing the linear voltage, thereby improving low power performance. Further, if feedback to the linear drive is used, variations in the output may be readily corrected. By using linear mode in conjunction with pulsed output mode, the pulsed output mode may be easily turned off when the energy across load 130 is near zero while the linear mode takes over, which will improve low power performance. Likewise, the linear mode may be turned off while the pulsed output mode takes over to increase high power efficiency.

Although the present invention has been described in considerable detail with reference to certain versions thereof, other versions are possible. As will be understood by those with ordinary skill in the art, by combining the described modes, H-bridge amplifier system 300 can be tailored to operate in a diverse manner, with characteristics and modes of operation that match system demands. For example, different enabling circuits may be used to control the production of a linear mode control signal or a pulsed control signal from control circuit 120. Further, many modes described only require a positive voltage supply and thus, a negative voltage supply terminal may be obviated. In each instance the method of interconnection establishes some desired electrical communication between two or more circuit nodes. Such communication may often be accomplished using a number of circuit configurations, as will be understood by those of ordinary skill in the art. Therefore, the spirit and scope of the appended claims should not be limited to the description of the versions depicted in the figures.

What is claimed is:

1. An amplifier, comprising:
   a control circuit having an input terminal receiving an analog input signal and an output terminal, said control circuit comprising:
      a linear mode control circuit coupled to said input terminal and said output terminal, said linear mode control circuit outputting a linear control signal;
      a pulsed mode control circuit coupled to said input terminal and said output terminal, said pulsed mode control circuit outputting a pulsed control signal;
      an enable circuit for receiving a select signal, said enable circuit coupled to said linear mode control circuit and said pulsed mode control circuit, said enable circuit enabling one of said linear control signal and pulsed control signal to be output on said output terminal in response to said select signal; and
   an output stage having a first input terminal coupled to said output terminal of said control circuit, a second input terminal coupled to a first voltage supply terminal, a third input terminal coupled to a second voltage supply terminal, and an amplifier output terminal, said output stage comprising:
      a first transistor having a first input terminal coupled to said output terminal of said control circuit, a second input terminal coupled to said first voltage supply terminal, and an output terminal connected to said amplifier output terminal; and
      a second transistor having a first input terminal coupled to said output terminal of said control circuit, a second input terminal coupled to said second voltage supply terminal, and an output terminal connected to said amplifier output terminal;
   wherein said output stage operates in a linear range when receiving said linear control signal on said output terminal of said control circuit and operates in a saturation range when receiving said pulsed control signal on said output terminal of said control circuit.

2. The amplifier of claim 1, wherein:
   said control circuit has a second input terminal for receiving said select signal, said second input terminal coupled to said enable circuit; and
   said control circuit has a second output terminal, said linear mode control circuit being further coupled to said second output terminal of said control circuit, said pulsed mode control circuit being further coupled to said second output terminal of said control circuit, said first input terminal of said second transistor being coupled to said second output terminal.

3. An amplifier, comprising:
   a control circuit having an input terminal receiving an analog input signal and an output terminal, said control circuit comprising:
      a linear mode control circuit coupled to said input terminal and said output terminal, said linear mode control circuit outputting a linear control signal;
      a pulsed mode control circuit coupled to said input terminal and said output terminal, said pulsed mode control circuit outputting a pulsed control signal;
      an enable circuit for receiving a select signal, said enable circuit coupled to said linear mode control circuit and said pulsed mode control circuit, said enable circuit enabling one of said linear control signal and pulsed control signal to be output on said output terminal in response to said select signal, said enable circuit comprising a switch that switchably couples one of said linear mode control circuit and said pulsed mode control circuit to said input terminal of said control circuit in response to said select signal; and
   an output stage having a first input terminal coupled to said output terminal of said control circuit, a second input terminal coupled to a first voltage supply terminal, a third input terminal coupled to a second voltage supply terminal, and an amplifier output terminal;
   wherein said output stage operates in a linear range when receiving said linear control signal on said output terminal of said control circuit and operates in a saturation range when receiving said pulsed control signal on said output terminal of said control circuit.

4. The amplifier of claim 1, wherein said first and second transistors are insulated gate bipolar transistors.

5. The amplifier of claim 1, further comprising a third transistor having a first input terminal coupled to said pulsed mode control circuit, a second input terminal coupled to a third voltage supply terminal, and an output terminal coupled to said amplifier output terminal, wherein said third transistor is conducting when both of said first and second transistors are non-conducting, said third transistor is driven in a saturation range when said pulsed control signal is on said output terminal of said control circuit, and said third transistor is non-conducting when said linear control signal is on said output terminal of said control circuit.

6. An amplifier, comprising:
    a control circuit having an input terminal receiving an analog input signal and an output terminal, said control circuit comprising:
        a linear mode control circuit coupled to said input terminal and said output terminal, said linear mode control circuit outputting a linear control signal;
        a pulsed mode control circuit coupled to said input terminal and said output terminal, said pulsed mode control circuit outputting a pulsed control signal;
        an enable circuit for receiving a select signal, said enable circuit coupled to said linear mode control circuit and said pulsed mode control circuit, said enable circuit enabling one of said linear control signal and pulsed control signal to be output on said output terminal in response to said select signal;
    a first output stage having a first input terminal coupled to said output terminal of said control circuit, a second input terminal coupled to a first voltage supply terminal, a third input terminal coupled to a second voltage supply terminal, and an amplifier output terminal;
    wherein said first output stage operates in a linear range when receiving said linear control signal on said output terminal of said control circuit and operates in a saturation range when receiving said pulsed control signal on said output terminal of said control circuit; and
    a second output stage having a first input terminal coupled to a second output terminal of said control circuit, a second input terminal coupled to said first voltage supply terminal, a third input terminal coupled to said second voltage supply terminal, and a second amplifier output terminal;
    wherein said second output stage operates in a linear range when receiving said linear control signal on said second output terminal of said control circuit and operates in a saturation range when receiving said pulsed control signal on said second output terminal of said control circuit.

7. The amplifier of claim 6, wherein said second output stage comprises:
    a fourth transistor having a first input terminal coupled to a second output terminal of said control circuit, a second input terminal coupled to said first voltage supply terminal, and an output terminal connected to a second amplifier output terminal;
    a fifth transistor having a first input terminal coupled to said second output terminal of said control circuit, a second input terminal coupled to said second voltage supply terminal, and an output terminal connected to said second amplifier output terminal; and
    wherein said first, second, fourth, and fifth transistors are arranged as an H-bridge amplifier.

8. The amplifier of claim 7, further comprising:
    a third transistor having a first input terminal coupled to said pulsed mode control circuit, a second terminal coupled to a third voltage supply terminal, and an output terminal coupled to said amplifier output terminal, wherein said third transistor is conducting when both of said first and second transistors are non-conducting, said third transistor is driven in a saturation range when said pulsed control signal is on said output terminal of said control circuit, and said third transistor is non-conducting when said linear control signal is on said output terminal of said control circuit; and
    a sixth transistor having a first input terminal coupled to said pulsed mode control circuit, a second input terminal coupled to said third voltage supply terminal, and an output terminal coupled to said second amplifier output terminal, wherein said sixth transistor is conducting when both of said fourth and fifth transistors are non-conducting, said sixth transistor is driven in a saturation range when said pulsed control signal is on said second output terminal of said control circuit, and said sixth transistor is non-conducting when said linear control signal is on said second output terminal of said control circuit.

9. A method of amplifying an analog input signal, said method comprising:
    receiving a select signal from an external source;
    generating a control signal in proportion to said analog input signal, wherein said control signal is one of a linear control signal and a pulsed control signal in response to said select signal;
    providing said control signal to an output stage;
    driving said output stage within its linear range in response to said linear control signal to produce a linear output signal; and
    turning on said output stage by driving said output stage into saturation and turning off said output stage in response to said pulsed control signal to produce a pulsed output signal;
    wherein said output stage comprises:
        a first transistor having a first input terminal that inputs said control signal, a second input terminal coupled to a first voltage supply terminal, and an output terminal connected to an amplifier output terminal that outputs at least one of said linear output signal and said pulsed output signal; and
        a second transistor having a first input terminal that inputs said control signal, a second input terminal coupled to a second voltage supply terminal, and an output terminal connected to said amplifier output terminal.

10. An apparatus, comprising:
    a control circuit which receives an analog input signal and a select signal, said control circuit having an output terminal, said control circuit produces a control signal proportional to said analog input signal on said output terminal, wherein said control circuit produces a control signal that is in the form of one of pulsed mode and linear mode in response to said select signal;
    a plurality of voltage supply terminals; and
    an output stage having a first input terminal coupled to one of said plurality of voltage supply terminals, a second input terminal coupled to a different one of said plurality of voltage supply terminals, a third input terminal coupled to said output terminal of said control circuit, and an output terminal, said output stage comprising;

a first transistor having a first input terminal coupled to one of said plurality of voltage supply terminals, a second input terminal coupled to said output terminal of said control circuit, and an output terminal, said first transistor produces a first output signal on said output terminal;

a second transistor having a first input terminal coupled to one of said plurality of voltage supply terminals, a second input terminal coupled to said output terminal of said control circuit, and an output terminal, said second transistor produces a second output signal on said output terminal, said output terminal of said second transistor being coupled to said output terminal of said first transistor; and wherein said first and second output signals are proportional to said control signal and are at least one of a pulsed mode output signal and a linear mode output signal in response to said control signal;

wherein said output stage produces an output signal that is proportional to said control signal and is at least one of a pulsed mode output signal and a linear mode output signal in response to said control signal.

11. The apparatus of claim 10, wherein said first and second transistors are insulated gate bipolar transistors.

12. The apparatus of claim 10, wherein said first output signal is a positive output signal and said second output signal is a negative output signal.

13. An apparatus, comprising:

a control circuit which receives an analog input signal and a select signal, said control circuit having an output terminal, said control circuit produces a control signal proportional to said analog input signal on said output terminal, wherein said control circuit produces a control signal that is in the form of one of pulsed mode and linear mode in response to said select signal, said control circuit comprising:

a linear mode control circuit receiving said analog input signal and generating a linear mode control signal proportional to said analog input signal;

a pulsed mode control circuit receiving said analog input signal and generating a pulsed mode control signal proportional to said analog input signal;

wherein one of said linear mode control signal and said pulsed mode control signal is provided on said output terminal of said control circuit in response to said select signal; and an enable circuit receiving said select signal, said enable circuit switchably connecting one of said linear mode control circuit and said pulsed mode control circuit to said analog input signal in response to said select signal;

a plurality of voltage supply terminals; and an output stage having a first input terminal coupled to one of said plurality of voltage supply terminals, a second input terminal coupled to a different one of said plurality of voltage supply terminals, a third input terminal coupled to said output terminal of said control circuit, and an output terminal;

wherein said output stage produces an output signal that is proportional to said control signal and is at least one of a pulsed mode output signal and a linear mode output signal in response to said control signal.

14. The apparatus of claim 13, wherein said first input terminal of said output stage is coupled to a ground potential.

15. The apparatus of claim 10, further comprising:

a third transistor having a first input terminal coupled to a ground potential, a second input terminal coupled to said control circuit, and an output terminal coupled to said output terminals of said first and second transistors, said third transistor turns on when said first and second transistors are off and said control signal is in pulsed mode.

* * * * *